(12) United States Patent
Sarkar

(10) Patent No.: US 12,433,175 B2
(45) Date of Patent: Sep. 30, 2025

(54) REACTOR TO FORM FILMS ON SIDEWALLS OF MEMORY CELLS

(71) Applicant: Micron Technology, Inc., Boise, ID (US)

(72) Inventor: Santanu Sarkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 353 days.

(21) Appl. No.: 17/178,086

(22) Filed: Feb. 17, 2021

(65) Prior Publication Data

US 2022/0263023 A1    Aug. 18, 2022

(51) Int. Cl.
| | |
|---|---|
| H10N 70/00 | (2023.01) |
| C23C 16/40 | (2006.01) |
| C23C 16/455 | (2006.01) |
| C23C 16/458 | (2006.01) |
| C23C 16/46 | (2006.01) |
| H01L 21/02 | (2006.01) |
| H01L 21/687 | (2006.01) |
| H10B 63/00 | (2023.01) |
| H10N 70/20 | (2023.01) |

(52) U.S. Cl.
CPC ......... *H10N 70/011* (2023.02); *C23C 16/407* (2013.01); *C23C 16/45544* (2013.01); *C23C 16/4584* (2013.01); *C23C 16/46* (2013.01); *H01L 21/02164* (2013.01); *H01L 21/02222* (2013.01); *H01L 21/0228* (2013.01); *H01L 21/68764* (2013.01); *H10B 63/80* (2023.02); *H10N 70/231* (2023.02); *H10N 70/882* (2023.02)

(58) Field of Classification Search
CPC ....... H10N 70/00; H01L 21/687; H10B 63/00
See application file for complete search history.

(56) References Cited

U.S. PATENT DOCUMENTS

| | | |
|---|---|---|
| 7,118,779 B2 | 10/2006 | Verghese et al. |
| 2003/0207593 A1 | 11/2003 | Derderian et al. |
| 2008/0274615 A1 | 11/2008 | Vaartstra |
| 2016/0035542 A1 | 2/2016 | Hausmann |
| 2019/0348273 A1 | 11/2019 | Tang et al. |
| 2020/0071828 A1 | 3/2020 | Jongbloed et al. |
| 2020/0111806 A1* | 4/2020 | Wang ............. H01L 29/40117 |
| 2020/0185259 A1 | 6/2020 | Kei et al. |
| 2020/0370180 A1 | 11/2020 | Agarwal et al. |
| 2022/0081769 A1* | 3/2022 | Chaney ............. H01L 21/02178 |

* cited by examiner

*Primary Examiner* — Marvin Payen
(74) *Attorney, Agent, or Firm* — Greenberg Traurig

(57) ABSTRACT

Apparatus and methods related to forming films on sidewalls of memory cell stacks in memory and logic devices. In one approach, a silicon wafer is held in a chamber of an atomic layer deposition (ALD) reactor. A temperature in the reactor is controlled to a first temperature (e.g., room temperature or below) where a first gas reactant that is provided into the chamber condenses and is adsorbed on the target wafer or substrate. The first reactant or precursor is partly vaporized at a second temperature in the reactor that is greater than the first temperature. A second gas reactant is provided into the chamber. The second gas reactant reacts with the adsorbed portion of the first gas reactant in its activated state. The reaction product is a film on the sidewall of a memory cell stack or logic devices. The foregoing steps are repeated to form a desired thickness of the film.

18 Claims, 9 Drawing Sheets

| ALD Type | Precursor | Reactant/Plasma Gas | Second Temperature | Deposited Materials |
|---|---|---|---|---|
| Thermal | DEZ | $H_2O$ | 50-200 C | ZnO |
| Thermal | $TiCl_4$ | $H_2O$ | 100-150 C | $TiO_2$ |
| Thermal | DEZ+TMA | $H_2O$ | 150-250C | AlZnO |
| Thermal | DEZ+TIP | $H_2O$ | 150-250C | TiZnO |
| Thermal | TMA | $H_2O$ | 85-200C | $Al_2O_3$ |
| Thermal | TDMAT | $H_2O$ | 90C | $TiO_2$ |
| Thermal | TDMAT | $NH_3$ | 150-350C | TiN |
| Plasma-enhanced | Si-precursors | $O_2$ | 150-350C | $SiO_2$ |
| Plasma-enhanced | TMA | $O_2$ | 75C | $Al_2O_3$ |
| Plasma-enhanced | TMA | $NH_3$ | 150-200C | AlN |
| Plasma-enhanced | $GaMe_3$ | $N_2/H_2$ | 200C | GaN |
| Plasma-enhanced | $MeCpPtMe_3$ | $O_2/H_2$ | RT | Pt |

FIG. 11

REACTOR TO FORM FILMS ON SIDEWALLS OF MEMORY CELLS

FIELD OF THE TECHNOLOGY

At least some embodiments disclosed herein relate to fabrication of memory devices or semiconductor devices in general, and more particularly, but not limited to a reactor used to form layers (e.g., films) on sidewalls of memory cell stacks in memory devices, or on other structures in a semiconductor device.

BACKGROUND

Atomic layer deposition (ALD) is typically used for forming thin films of materials on substrates such as silicon wafers. In one example, ALD is a vapor deposition in which a film is built up through self-saturating reactions performed in cycles. The thickness of the film is determined by the number of cycles performed.

In one example of an ALD process, gaseous precursors are supplied, alternatingly and repeatedly, to the substrate or wafer to form a thin film of material on the wafer. One reactant adsorbs in a self-limiting process on the wafer. A subsequent reactant pulse reacts with the adsorbed material to form a single molecular layer of the desired material. In a typical ALD reaction, no more than a molecular monolayer forms per cycle. Thicker films are produced through repeated growth cycles until the target thickness is achieved.

In a typical ALD process, one or more substrates with at least one surface to be coated and reactants for forming a desired product are introduced into the reactor or deposition chamber. The one or more substrates are typically placed on a wafer support (e.g., susceptor). The wafer support is located inside a chamber within the reactor. The wafer is heated to a desired temperature above the condensation temperatures of the reactant gases.

Typically, when using ALD, each reactant is delivered to the substrate in a pulse until a saturated surface condition is reached. One reactant typically adsorbs on the substrate surface, and a second reactant subsequently reacts with the adsorbed species during the subsequent pulse. To obtain a self-limiting growth, vapor phase reactants are kept separated by purge or other removal steps between sequential reactant pulses.

Typically, a shorter duration purge step can increase the available time for adsorption and reaction of the reactants within the reactor, but the vapor phase reactants are not allowed to mix to avoid the risk of CVD reactions destroying the self-limiting nature of the deposition. As the growth rate is self-limiting, the rate of growth is proportional to the repetition rate of the reaction sequences, rather than to the temperature or flux of reactant as in CVD.

BRIEF DESCRIPTION OF THE DRAWINGS

The embodiments are illustrated by way of example and not limitation in the figures of the accompanying drawings in which like references indicate similar elements.

FIG. 11 shows a table of reactants and corresponding reaction products used to form layers in the reactor of FIG. 1, in accordance with some embodiments.

DETAILED DESCRIPTION

Figure 1:
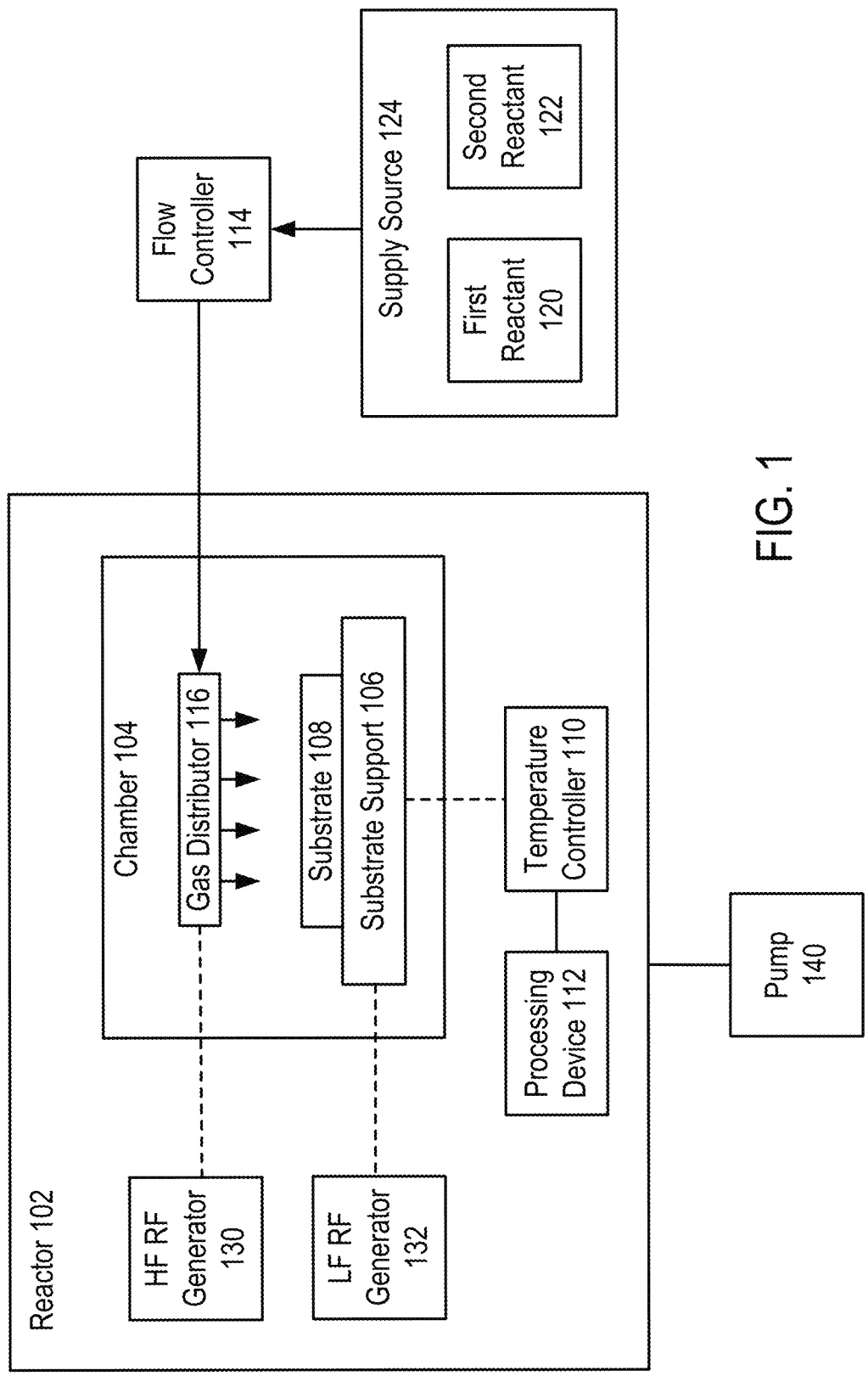
FIG. 1 shows a reactor used to form layers (e.g., films) on sidewalls of memory cell stacks in memory devices, in accordance with some embodiments.

The following disclosure describes various embodiments using a reactor to form layers (e.g., films) on sidewalls of memory cell stacks in memory devices. In other embodiments, the layers can be formed on other types of structures in a semiconductor device. When fabricating memory cell stacks in a memory device, it can be difficult to deposit films on certain portions of the cell stack structures. This can be caused by conditions such as high aspect ratio trenches, and/or overhanging layers that obstruct deposition onto underlying areas of the cell stack structure. For example, wherever there are depressed corners in a high aspect ratio trench and a reversely tapered shape of a layer together in the same trench/structure, film growth thereon while maintaining high step coverage and quality is particularly difficult.

At least some embodiments herein provide a method of growing conformal films in structurally enervated regions (e.g., areas that are difficult for deposition, as described above). In some embodiments, an atomic layer deposition (ALD) method is provided to form conformal films within and/or near the bottom of such trenches, and/or in other areas that present difficulty for deposition. Other types of semiconductor device structures can similarly have areas where it is difficult to deposit a film or other layer. Various embodiments herein can also be used to form conformal films on these other structures.

The continuing trend of increasing miniaturization of memory devices increases manufacturing demands. For example, patterns and continuous scaling of critical dimensions for cell array lines and spacings make it increasingly difficult to deposit films and maintain quality films. These difficulties are particularly acute inside depressed portions in patterns or sidewalls of cell stack arrays.

One example is observed in post-etch tapered tungsten profiles (e.g., after first and second cut). This is sometimes observed as a trapezoid-like tungsten profile or shape of a depressed region (e.g., shape of a tungsten layer as found at the bottom of memory cell stacks in a memory array). In one example, tungsten-lamina feet of a phase change memory cell stack in array stacks create an overhanging obstruction that blocks underlying deposition.

Tungsten is more difficult to etch than the other materials used in a typical memory cell stack (e.g., chalcogenide, phase change material, etc.) so that more aggressive chemistry is used to etch tungsten. However, this aggressive chemistry can damage the other materials of the memory cell stack. Balancing these competing factors during manufacture can result in significant variations (e.g., depressions, protrusions, etc.) in the vertical side profile of the memory cell stack (e.g., the trapezoid-like profile above, depressed regions, etc.).

The above difficulties can lead to formation of weak spots (e.g., too thin of a film) or voids in cell stack sidewalls. As a result, these depressed regions (e.g., found at the bottom of a trench on the sidewalls) can have deterioration in step coverage and film quality. This can cause an increase in etching rate, poor adhesion, and/or weak mechanical strength of the fabricated structures in the memory device. For example, these difficulties can be particularly challenging to perform in high aspect ratio chalcogenide memory cell stack array sidewalls (e.g., as used in a three-dimensional cross point memory architecture).

To address these and other technical problems, in various embodiments, a method for growing a film vitalizes structurally depressed regions by providing quality conformal film growth. In some embodiments, the method includes sequential cyclic supply of selected pairs of reactants (e.g., reactive gases) inside a vacuum chamber to enable growth of films in structurally difficult (enervated) regions. In one example, the film is grown by forming multiple layers by ALD.

In one example, the film provides a sidewall on a memory cell stack in a memory array having a three-dimensional cross point architecture. In one example, the film is formed in a NAND flash memory array having multiple tiers (e.g., greater than 100 tiers).

In some embodiments, a substrate (e.g., silicon wafer) having memory cell stack arrays with depressed portions formed thereon are placed on a cooled substrate support (e.g., chuck) below or at or slightly above room temperature. Then, a temperature of the substrate is adjusted to a temperature at which a first reactive gas is adsorbed and condensed on the substrate. The first reactive gas is supplied and thereby deposits a condensed substance of the first reactive gas on the substrate. The substrate is rotated while the first reactive gas is supplied.

Next, the condensed substance is partly vaporized by supplying a heated gas to the substrate. Then, a second reactive gas in an activated state is supplied to the substrate, thereby causing the second reactive gas to react with the condensed substance to form a film. This method is repeated to deposit additional layers so as to form the desired thickness of film. In one example, the film is a sidewall for a memory cell stack and is formed in trenches between cell stacks of a memory array.

In one embodiment, a method for ALD includes holding a substrate in a vacuum chamber of an ALD reactor. A temperature in the reactor is controlled to a first temperature (e.g., room temperature or lower). A first reactant is provided into the chamber. A portion of the first reactant condenses on the substrate. After the portion of the first reactant condenses on the substrate, the temperature is controlled to a second temperature. The second temperature is greater than the first temperature (e.g., greater by at least 50 to 150 degrees Celsius). A second reactant is provided into the chamber, and the second reactant reacts with the first reactant to form a reaction product (e.g., films to provide a sidewall).

In one embodiment, at least two reactive gases of different types are used to form a film on a wafer. The wafer is held on a chuck in an ALD reactor. One of the reactive gases is condensable at a low temperature in a chamber of the reactor. The temperature of the wafer chuck is switchable from cold to hot, and is also configured to rotate and/or tilt the wafer position relative to a gas supply that is directed towards the wafer. Different reactive gases are sequentially supplied towards the wafers for growing the film.

In one embodiment, the film growth cycles use either a plasma process or a thermal process, or combination of the two processes. In one embodiment, repetition of plasma irradiation and thermal annealing on the as-grown film can be used for improving the film quality.

In one embodiment, silicon oxide film is grown over high-aspect-ratio cell array sidewalls (having depressed areas such as described above) by liquefying tetraethyl orthosilicate (TEOS) gas on a substrate in a first pulse, and then introducing oxygen gas under heating in a second pulse. These pulses are repeated multiple times until a desired thickness of the film is achieved.

In one embodiment, the first reactive gas is condensed in a first pulse. Next, the condensed gas (or liquid) is partly vaporized by heat application. The second reactive gas is supplied at a higher temperature on the condensed or partly vaporized first gas to react with the first gas, thus forming a reaction product (e.g., the desired film in structurally challenging regions in cell sidewalls).

Advantages provided by various embodiments described herein include the following. In one advantage, chalcogenide or other memory devices can be manufactured with improved reliability performance. In another advantage, high quality films can be grown in structurally enervated regions of memory array stacks, thus eliminating weak spots or voids.

FIG. 1 shows a reactor 102 used to form layers (e.g., films) on sidewalls of memory cell stacks in memory devices, in accordance with some embodiments. Reactor 102 includes at least one chamber 104. A substrate support 106 holds a substrate 108 in chamber 104. Gas distributor 116 distributes reactants towards substrate 108 when one or more layers are being formed.

Flow controller 114 controls flows of reactants into chamber 104. The reactants are obtained from supply source 124. The reactants include first reactant 120 and second reactant 122. In one example, first reactant 120 is provided to chamber 104 in one or more pulses. Chamber 104 is then purged. Then, second reactant 122 is provided to chamber 104 in one or more pulses.

The reactants are typically distributed by gas distributor 116 in a gaseous form. However, the reactants in supply source 124 may be, for example, stored in a liquid or gas form. In some embodiments, one or more inert gases may be mixed with a reactant from supply source 124 for providing to gas distributor 116.

A temperature controller 110 controls a temperature of substrate 108 during processing in chamber 104. In one embodiment, temperature controller 110 controls a temperature of substrate support 106 by heating and/or cooling substrate support 106. This heating and/or cooling causes the temperature of substrate 108 to correspondingly increase and/or decrease. In other embodiments, temperature controller 110 may control the temperature of substrate 108 via other heating or cooling mechanisms such as heating elements disposed above or near substrate 108 in chamber 104, or heated or cooled gases provided to chamber 104.

Processing device 112 controls various operations of reactor 102. Processing device 112 controls temperature controller 110. Reactor 102 is evacuated by a pump 140 to create a low pressure environment (e.g., near vacuum) in chamber 104. In one embodiment, pump 140 is controlled by processing device 112. Pump 140 can be used to evacuate reactants and/or purge gases from chamber 104 during processing.

Reactor 102 also includes high-frequency (HF) radio frequency (RF) generator 130 and low-frequency (LF) radio frequency (RF) generator 132. In one embodiment, high-frequency radio frequency generator 130 creates a radio frequency (RF) field that activates second reactant 122 as it is provided by gas distributor 116. In one example, the RF field is created in the region between gas distributor 116 and substrate 108. In one example, HF RF generator 130 operates at a frequency of at least 13 megahertz (MHz). In one example, LF RF generator 132 operates at a frequency of less than one megahertz (1 MHz).

In one embodiment, low-frequency radio frequency generator 132 biases substrate support 106 to provide directionality for activated portions of first reactant 120 and/or second reactant 122.

In various embodiments, temperature controller 110 controls a temperature of substrate 108 to various temperatures during processing. In one embodiment, the temperature of substrate 108 is controlled to a first temperature and a second temperature. The temperature is controlled to the first temperature when first reactant 120 is provided into chamber 104. The temperature is controlled to the second temperature when second reactant 122 is provided into chamber 104. The second temperature is greater than the first temperature. The difference between the first temperature and the second temperature will vary depending on the particular reactants selected for use. In one example, the first temperature is 25 degrees Celsius or lower (e.g., 10 degrees Celsius). In one example, the first temperature is room temperature or lower. In one example, the second temperature is greater than the first temperature by at least 50 degrees Celsius.

In one embodiment, first reactant 120 is provided into chamber 104 so that a condensed portion of first reactant 120 is absorbed on substrate 108. Chamber 104 is then purged using, for example, nitrogen gas. Chamber 104 is evacuated using pump 140.

Then, temperature controller 110 increases the temperature of substrate 108 from the first temperature to the second temperature. As a result, the condensed portion of first reactant 120 is partially vaporized. Second reactant 122 is provided into chamber 104 and reacts with first reactant 120 to form a reaction product on substrate 108. In one example, the reaction product is one or more layers (not shown) formed on sidewalls of memory cell stacks (not shown) of a memory array located at a top surface of substrate 108.

In one embodiment, substrate support 106 can be moved during processing to provide various motions of substrate 108 as gases are distributed by gas distributor 116. In one example, substrate 108 is rotated and/or tilted, as described further below.

In some embodiments, temperature controller 110 controls various temperatures in reactor 102. As mentioned above, temperature controller 110 can control a temperature of substrate 108. In one embodiment, temperature controller 110 controls substrate support 106 to first and second temperatures. In one embodiment, temperature controller 110 controls first and second temperatures of an ambient atmosphere in chamber 104 (e.g., a temperature of an inert gas provided to chamber 104 with first reactant 120 and/or second reactant 122).

In one example, substrate 108 is levitated above the substrate support 106 by pusher pins (not shown). In one example, the pusher pins are controlled by processing device 112 and can move substrate 108 up or down vertically.

In one example, flow controller 114 includes one or more mass flow controllers, each mass flow controller used to control a flow of a reactant from supply source 124. A mass flow controller can also be used to control the flow of one or more carrier or inert gases mixed with liquid reactant precursors that are provided from a pressurized-fluid source of supply source 124.

In one example, gas distributor 116 is a gas manifold. In one example, gas distributor 116 includes multiple gas inlets, each inlet having an independent direction control that is controlled by processing device 112. The direction can be varied depending on the reactant being distributed. In one example, the direction of one or more gas inlets is changed after distributing first reactant 120, but prior to distributing second reactant 122.

Figure 2:
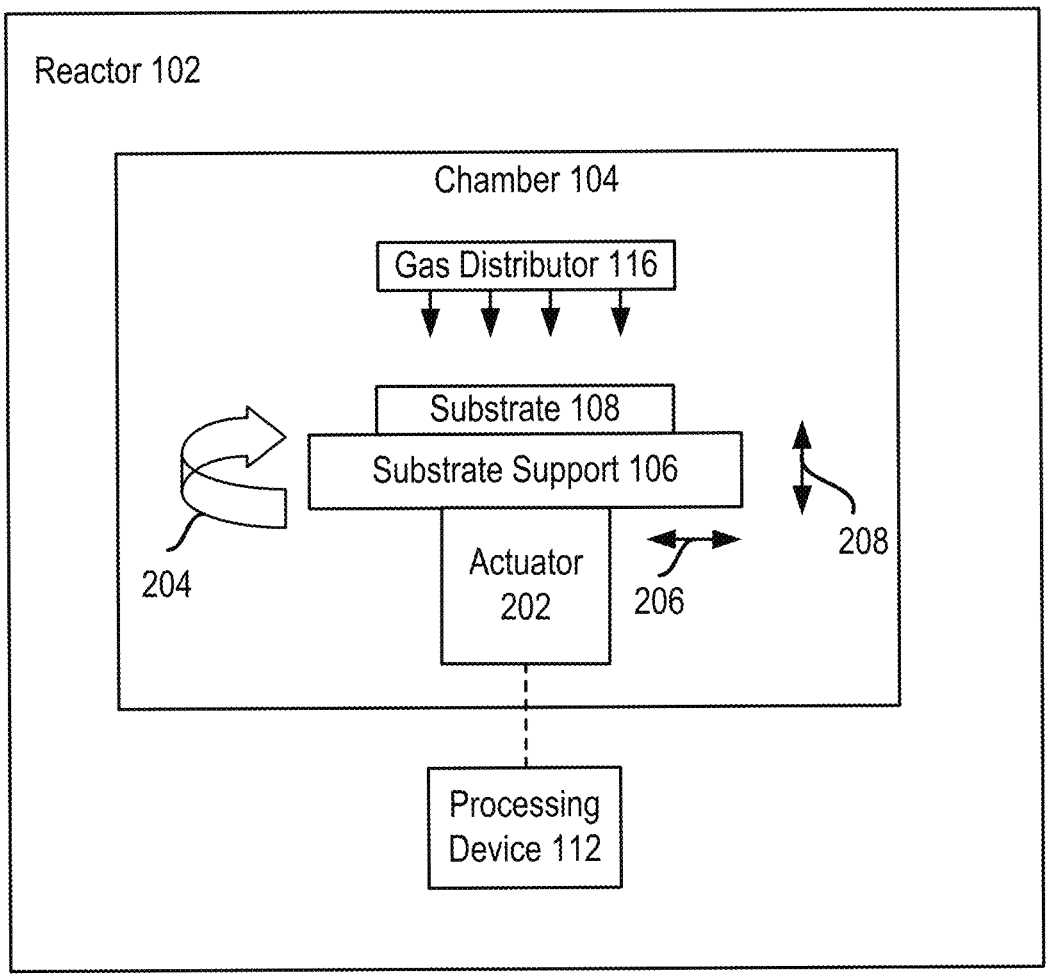
FIG. 2 shows a substrate support for the reactor of FIG. 1 that is configured to provide motion a substrate when forming layers on sidewalls of memory cell stacks on the substrate, in accordance with some embodiments.

FIG. 2 shows substrate support 106 of the reactor 102 of FIG. 1. Substrate support 106 is configured to move substrate 108 when forming layers (not shown) on sidewalls of memory cell stacks on the substrate, in accordance with some embodiments. In one embodiment, substrate support 106 is moved by actuator 202. In one example, actuator 202 is an electric motor. In one example, actuator 202 imparts motion using a magnetic and/or electric field that couples to substrate 108.

Actuator 202 can move substrate support 106 in one or more motions. These motions can include moving the substrate support 106 horizontally 206, moving the substrate support 106 vertically 208, and/or rotating 204 substrate support 106. In one example, substrate 108 is rotated at least partially in a same direction as a flow of gas provided by gas distributor 116. In one example, substrate 108 is rotated at least partially in an opposite direction of a flow of gas provided by gas distributor 116. In one example, the direction and/or speed of rotation is varied for different reactants. Additionally and/or alternatively, substrate support 106 can be tilted, as discussed below.

Figure 3:
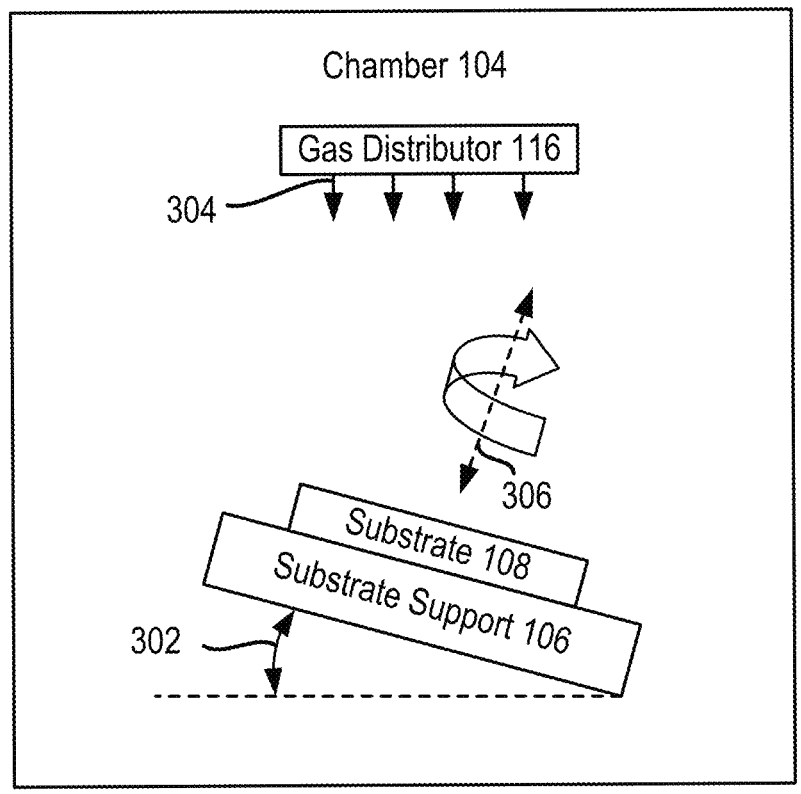
FIG. 3 shows tilting and rotation of a substrate support holding a substrate on which layers are being formed, in accordance with some embodiments.

FIG. 3 shows tilting and rotation of substrate support 106 while holding substrate 108 on which layers are being formed, in accordance with some embodiments. As mentioned above, substrate support 106 can be tilted during processing. For example, substrate support 106 can be tilted by an angle 302 from a horizontal plane (illustrated as a dashed line) that is perpendicular to a vertical flow of gas 304 from gas distributor 116. In one example, when substrate 108 is tilted, substrate 108 is also rotated about axis 306 as gas 304 is provided.

In one embodiment, a target substrate or device is placed on substrate support 106 in chamber 104. Chamber 104 is evacuated by pump 140. A first reactive gas flow is provided inside chamber 104 onto the target object to absorb a condensed first gas substance on the target object. In one example, the target object is a memory cell stack.

The target object is heated to partially vaporize the condensed first gas substance. A second reactive gas flow is provided inside chamber 104. The second reactive gas flow is in an activated state and provided onto the target object. This results in the second reactive gas reacting with the condensed first gas substance to form a reaction product. The reaction can be activated thermally and/or by the presence of the plasma. In one example, the gas flows are provided in a rotational direction of substrate 108. These steps are repeated to attain the desired thickness of the film or other feature being formed.

In one embodiment, the reaction product is a film that is embedded in a structurally enervated or depressed region of a semiconductor device. For example, the enervated or depressed region is a portion of the device onto which it is difficult to deposit material to form a film if using prior approaches.

In one embodiment, second reactant 122 reacts with the partially vaporized first reactant 120 and/or reacts with the condensed portion of first reactant 120. In one example, second reactant 122 reacts with the partially vaporized first reactant 120 spontaneously, and/or second reactant 122 reacts with the condensed portion of first reactant 120 in the presence of RF plasma power. Thus, both thermal and plasma-assisted atomic layer deposition (thermal ALD or PEALD) can be used.

In one embodiment, multiple film growth cycles use either a plasma process or a thermal process or a combination of the two processes. In one example, these cycles can involve repetition of plasma irradiation and thermal annealing on the as-grown film for improving the film quality.

In one embodiment, the film growth method involves choosing at least two reactive gases of different types, one which is condensable at a low temperature with a chamber system where the wafer chuck is switchable from cold to hot and is configured to move the wafer position (e.g., tilt and/or rotate) relative to a gas supply section while sequentially supplying different reactive gases towards the path of the wafers.

In one embodiment, the method involves condensing the first reactive gas in a first pulse, and later partly vaporizing the condensed gas (or liquid) from the first pulse by heat application. Then, the second reactive gas is introduced at a higher temperature on the condensed or partly vaporized first gas to be reacted with, which forms a reaction product (e.g., the desired film in structurally challenging regions in cell sidewalls).

In one example, a silicon oxide film is grown over high-aspect ratio cell array sidewalls in depressed areas by condensing (e.g., liquefying) tetraethyl orthosilicate (TEOS) gas on a substrate (e.g., wafer) in a first pulse and then introducing oxygen gas under heating in a second pulse. These steps are then repeated in the same way over multiple loops until a desired thickness of film is formed.

In some embodiments herein, vapor phase reactants used to form the film above are separated from each other, for example, by removing excess reactants and/or reactant byproducts from the reaction chamber between reactant pulses, or by providing different reactants in different spaces (e.g., providing first reactant 120 to a first chamber, and providing second reactant 122 to a second chamber—substrate 108 is moved from the first chamber to the second chamber), contacting the substrates with different reactants at different temperatures, and moving a substrate among the different spaces.

In some embodiments herein, different reactants can have different temperature stabilities. By way of example, nitride films such as AlN or TiN, which can be deposited in accordance with some embodiments herein, can be deposited using an metalorganic precursor, and a nitrogen precursor. In accordance with some embodiments herein, a reaction for a first precursor is performed in a first station (e.g., used to provide a first chamber in an ALD reactor 102) at a temperature suitable for the first precursor and in gas isolation from a second station (e.g., used to provide a second chamber in the ALD reactor 102), and a reaction for a second precursor is performed in a second station at a temperature suitable for the second precursor and in gas isolation from the first station.

In one embodiment, an ALD reactor supplies energy to reactable constituents or compounds in process gases in a chamber on the surface of a substrate. The supplied energy causes the reactable constituents to react and deposit a thin film onto an upper surface of the substrate. In one embodiment, the supplied energy includes thermal energy supplied by heat lamps. In one example, the lamps are positioned in the base of the chamber. The heat lamps emit a significant amount of near-infrared radiation that passes through a susceptor to heat the substrate. Alternatively, the susceptor is heated by the heat lamps and the substrate is heated by conduction from the susceptor. The heat lamps may be placed at alternate locations according to the parameters of the specific deposition process being performed.

In one embodiment, reaction energy is supplied by a radio frequency (RF) generator (e.g., 132). The RF generator creates an RF field between the substrate and an anode. In one example, the susceptor is grounded while the RF signal is applied to a process gas manifold (e.g., gas distributor 116). An RF anode may be provided separately, and the process gas manifold may be electrically isolated from the RF supply. For example, the RF signal is applied to the susceptor and the process gas manifold is grounded.

In one embodiment, energy sources are used to provide sufficient reaction energy in a region near the surface of the substrate to cause reaction. Combinations of thermal and plasma energy can be used to provide the necessary reaction energy.

In some embodiments, a reactant can be brought to an appropriate temperature or temperature range by a heated showerhead, a heated source vessel, a heated susceptor, a heated gas source line, a cooled source vessel, a cooled susceptor, a cooled gas source line, and/or temperature in the station (e.g., in a first chamber of a ALD reactor 102). Additionally and/or alternatively, the station can comprise a heating and/or cooling system thermally coupled to the station so as to bring the station to a desired temperature. For example, the heating system can include a heater or heating element, a lamp, thermal tape, thermal coils, a cooling fan, a coolant coil, or any combination of the foregoing items.

In some embodiments, a plasma provides energy to drive a deposition reaction, and thus can permit the reaction to be performed a lower temperature and/or faster speed than if it was driven only by thermal energy. Plasmas can be provided, for example, by a remote plasma generator, or in situ. In some embodiments, the first reactant is provided as a plasma or in conjunction with a plasma (e.g. for plasma enhanced ALD), and the second reactant is provided as a gas phase (e.g. for thermal deposition). In some embodiments, the first reactant is provided as a gas phase (e.g. for thermal deposition), and the second reactant is provided as a plasma or in conjunction with a plasma (e.g. for plasma enhanced ALD). In some embodiments, the first reactant and second reactant are each provided as a gas phase (e.g. for thermal deposition). In some embodiments, the first reactant is provided as a plasma or in conjunction with a plasma (e.g. for plasma enhanced ALD), and the second reactant is provided as a plasma or in conjunction with a plasma (e.g. for plasma enhanced ALD).

The surface of the substrate (e.g., a semiconductor wafer 108) is contacted with a vapor phase first reactant (e.g., 120). In some embodiments a pulse of vapor phase first reactant is provided to a reaction space (e.g., chamber 104) containing the substrate. In some embodiments the substrate is moved to a reaction space where vapor phase first reactant is provided. In one example, the vapor phase reactant is not present in the reaction space when the substrate is moved to the reaction space, and the vapor phase reactant is subsequently provided in the reaction space. In some embodiments, the vapor phase reactant is already present in the reaction space when the substrate is moved to the reaction space. Optionally, some vapor phase reactant is already present in the reaction space when the substrate is placed in the reaction space, and additional vapor phase second reactant is added to the reaction space thereafter.

In one embodiment, conditions are selected such that no more than about one monolayer of the first reactant is adsorbed on the substrate surface in a self-limiting manner. Excess first reactant and reaction byproducts, if any, are removed from the substrate surface, such as by purging with an inert gas or by removing the substrate from the presence of the first reactant.

In some embodiments, the vapor phase reactant is provided into the station at the appropriate temperature, and the substrate is on a susceptor that is also at this temperature. In some embodiments, the vapor phase reactant is provided at the appropriate temperature, and the station is at a different temperature. For example, the vapor phase reactant can be provided through a heated showerhead so as to be provided at a higher temperature than the temperature in the rest of the station. In some embodiments, the vapor phase reactant is provided in a station, and in the station the vapor phase reactant is heated or cooled to the appropriate temperature for contacting the substrate with the reactant, for example based on temperature in the rest of the station, and/or the temperature of the susceptor on which the substrate is positioned.

When purging (e.g., as part of an ALD film formation process), vapor phase precursors and/or vapor phase byproducts are removed from the substrate surface such as by evacuating a chamber with a vacuum pump and/or by replacing the gas inside a reactor with an inert gas such as argon or nitrogen. In one example, purging times are from 0.05 to 20 seconds (e.g., between 1 and 10 seconds, or between 1 and 2 seconds). However, other purge times can be utilized if necessary, such as where highly conformal step coverage over extremely high aspect ratio structures or other structures with complex surface morphology is needed, for example purge times of at least 20 seconds (e.g., at least 20-50 seconds).

The surface of the substrate can be contacted with a vapor phase second gaseous reactant at a second temperature that is different from and greater than the temperature at which the first reactant contacts the substrate. In some embodiments a pulse of a second gaseous reactant is provided to a reaction space containing the substrate. In some embodiments the substrate is moved to a reaction space where the vapor phase second reactant is provided. Optionally, the vapor phase second reactant is already present in the reaction space when the substrate is placed in the reaction space. Optionally, the vapor phase second reactant is not present in the reaction space when the substrate is placed in the reaction space, and the second reactant is subsequently added to the reaction space. Optionally, the second reactant can be added to the reaction space at an appropriate temperature that is either the same or different than the temperature of the rest of the station. Optionally, the second reactant can contact the substrate at a second temperature while a different substrate in a different station is contacted with the first reactant at a first temperature that is different from the second temperature. Optionally, some vapor phase second reactant is already present in the reaction space when the substrate is placed in the reaction space, and additional vapor phase second reactant is added to the reaction space thereafter. Excess second reactant and gaseous byproducts of the surface reaction, if any, are removed from the substrate surface.

In one example, the steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with other reactants can be included to form more complicated materials, such as ternary materials.

In one embodiment, an excess of reactant precursors is supplied in each phase to saturate the susceptible structure surfaces. Surface saturation ensures reactant occupation of all available reactive sites (subject, for example, to physical size restraints) and thus ensures excellent step coverage. Typically, no more than one molecular layer of material is deposited with each cycle (or less than one molecular layer of material is deposited with each cycle). However, in some embodiments more than one molecular layer can deposited during the cycle.

Removing excess reactants can include evacuating some of the contents of a reaction space and/or purging a reaction space with helium, nitrogen or another inert gas. In some embodiments, purging comprises turning off the flow of the reactive gas while continuing to flow an inert carrier gas to the reaction space.

In one embodiment, the precursors employed in the ALD type processes may be solid, liquid or gaseous materials under standard conditions (room temperature and atmospheric pressure), provided that the precursors are in vapor phase before they are contacted with the substrate surface. In one example, contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. In accordance with some embodiments herein, a first vapor phase reactant can be contacted with the substrate at a first temperature, and a second vapor phase reactant can be contacted with the substrate at a second temperature that is different from and greater than the first temperature. Each vapor phase reactant can be at the appropriate temperature prior to contacting the substrate (e.g. if the reactant is provided by a heated showerhead or if an entire station is at the appropriate temperature), or upon contacting the substrate (e.g. if the susceptor is heated to bring the substrate to the appropriate temperature).

In some embodiments the flow rate of precursors is between 1 sccm and 1000 sccm (e.g., between 100 sccm and 500 sccm). The pressure in a reaction chamber can be from about 0.01 to about 20 mbar (e.g., from 1 mbar to 10 mbar). However, in some cases the pressure will be higher or lower than this range.

In one embodiment, before starting the deposition of the film, the substrate is heated to a suitable growth temperature. In some embodiments, the substrate is placed on a heated susceptor. The growth temperature varies depending on the type of thin film formed, physical properties of the precursors, etc. The deposition temperature may vary depending on a number of factors such as, and without limitation, the reactant precursors, the pressure, flow rate, the arrangement of the reactor, and the composition of the substrate including the nature of the material to be deposited on. ALD in accordance with some embodiments herein can include thermal ALD. ALD in accordance with some embodiments herein can include thermal plasma assisted ALD or plasma enhanced ALD (PEALD).

Examples of suitable reactors that may be used include reactors with multiple stations (e.g., chamber 104), in which the stations are, or can be, placed in gas isolation from each other.

Figure 4:
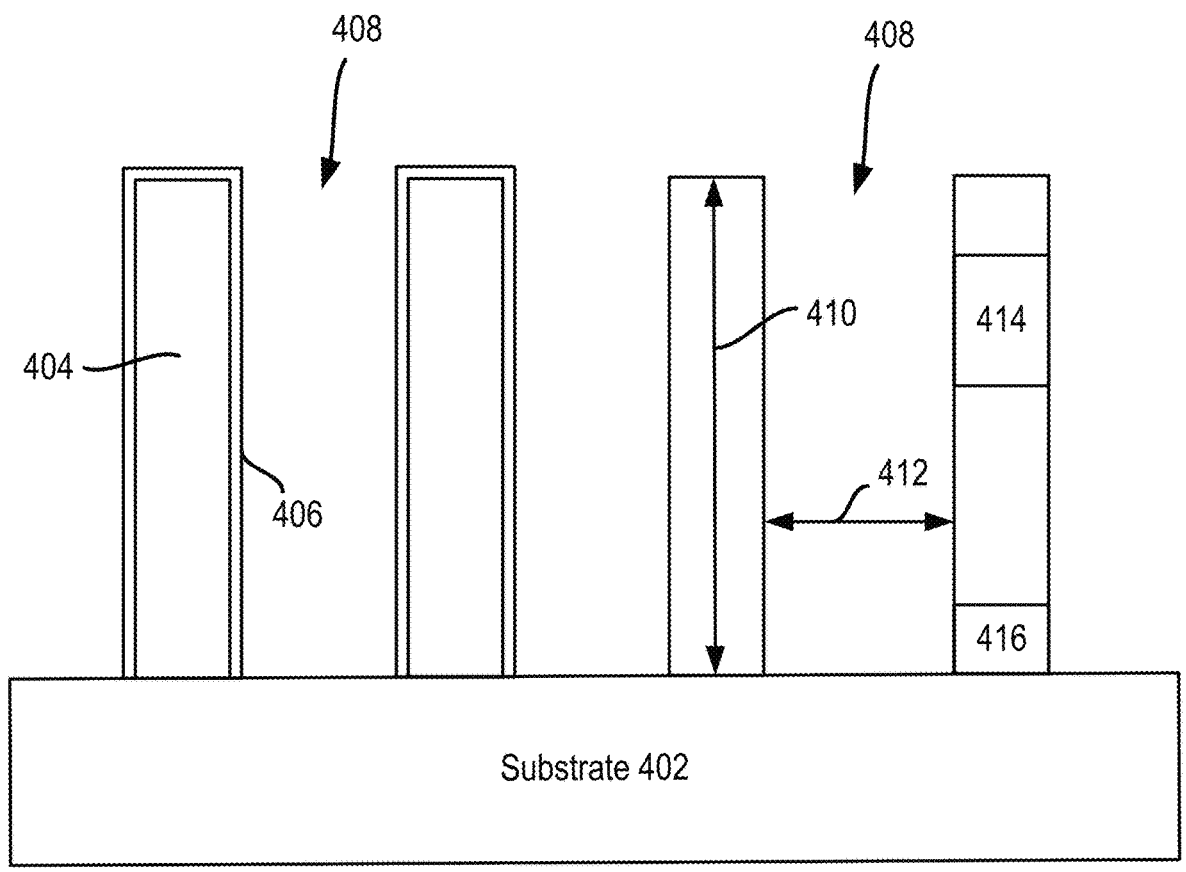
FIG. 4 shows a memory array including memory cell stacks separated by trenches, in accordance with some embodiments.

FIG. 4 shows a memory array including memory cell stacks 404 separated by trenches 408, in accordance with some embodiments. The memory array is located at a top surface of substrate 402.

Each memory cell stack 404 comprises layers corresponding to the type of memory device being fabricated. In one example, these layers include a chalcogenide, a phase change material, carbon, tungsten, etc. In one example, the memory array is formed in a three-dimensional cross point architecture.

In various embodiments, film 406 is formed on sidewalls of each memory cell stack 404. In one example, film 406 is formed as a reaction product of first reactant 120 and second reactant 122. Substrate 402 is an example of substrate 108. In one example, film 406 is formed in chamber 104 of reactor 102.

In one example, each memory cell stack 404 includes a tungsten layer 416 at a bottom of the stack. In one example, each memory cell stack 404 includes a layer 414 that provides a logic storage element. In one example, the logic storage element is a select device, or a phase change material (PCM). In one example, a chalcogenide layer 414 is located overlying a tungsten layer 416.

In one example, each trench 408 has a height 410 and a width 412. Height 410 corresponds to the height of memory cell stack 404 prior to forming film 406. Width 412 corresponds to the distance between memory cell stacks 404 prior to forming film 406. In one example, the method for forming film 406 as described above is particularly advantageous for trenches having an aspect ratio of greater than 10:1. The aspect ratio is determined by the height of the trench divided by the width of the trench.

Figure 5:
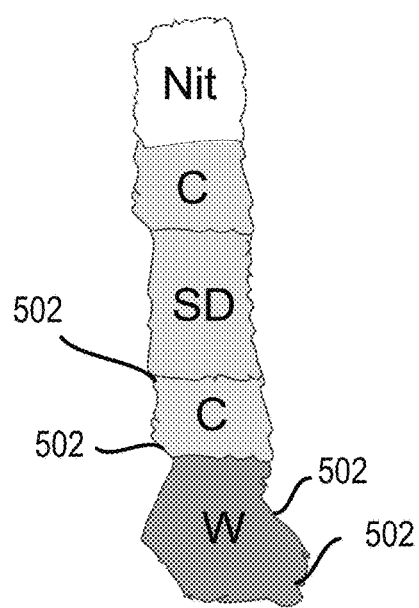
FIG. 5 shows a memory cell stack including a select device, in accordance with some embodiments.

FIG. 5 shows a memory cell stack including a select device (SD), in accordance with some embodiments. The memory cell stack is an example of memory cell stack 404. The memory cell stack includes the following layers: nitride (Nit), carbon (C), select device (SD), carbon (C), and tungsten (W). Regions 502 are examples of enervated and/or depressed areas of the memory cell stack in which deposition of a film is more difficult. In one example, film 406 is formed as a highly conformal film over these areas.

Figure 6:
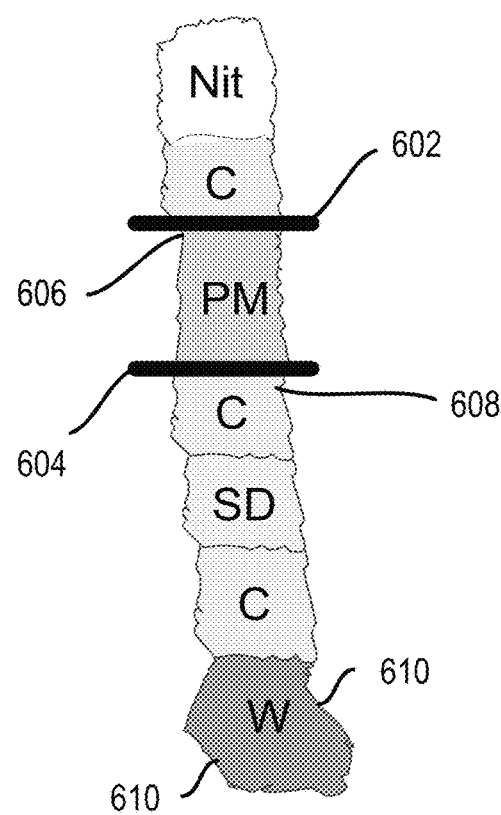
FIG. 6 shows a memory cell stack including a phase change material and a select device, in accordance with some embodiments.

FIG. 6 shows a memory cell stack including a phase change material (PM) and a select device (SD), in accordance with some embodiments. The memory cell stack is an example of memory cell stack 404. The memory cell stack includes the following layers: nitride (Nit), carbon (C), phase change material (PM), carbon (C), select device (SD), carbon (C), and tungsten (W). Regions 610 are examples of enervated and/or depressed areas of the memory cell stack in which deposition of a film is more difficult. In one example, film 406 is formed as a highly conformal film over these regions 610.

The memory cell stack also includes a thin tungsten layer 602 and a thin tungsten layer 604. In one example, layers 602 and 604 are tungsten lamina layers. Due to the difficulty in etching tungsten (e.g., etching resistance) relative to other materials of the memory cell stack, tungsten layers 602 and 604 protrude out away from other layers of the memory cell stack after etch processing. This protrusion causes an obstruction of regions 606 and 608 that makes subsequent deposition onto the sidewalls of the memory cell stack difficult. In one example, film 406 is formed as a highly conformal film over regions 606, 608, 610.

In one example, as miniaturization of patterns on memory arrays increases, the shape of resist masks and etch anisotropic issues (e.g., the impact of isotropic component) have greater influence on the shape of depressed areas on the sidewalls of memory cell stacks. In particular, depressed areas towards the bottom of trenches having a high aspect ratio are particularly difficult for depositing a film. Various embodiments as described herein permit formation of a conformal film (e.g., film 406) on these sidewalls such that these depressed areas are substantially or completely covered.

FIG. 7-10 show various structures on which layers (e.g., film 406) can be formed using reactor 102 of FIG. 1, in accordance with some embodiments. As discussed herein, conformal films can be formed on problem regions for deposition as may be found in various memory and other semiconductor device structures. In one example, these conformal films are formed in chamber 104 on substrate 108.

Figure 7:
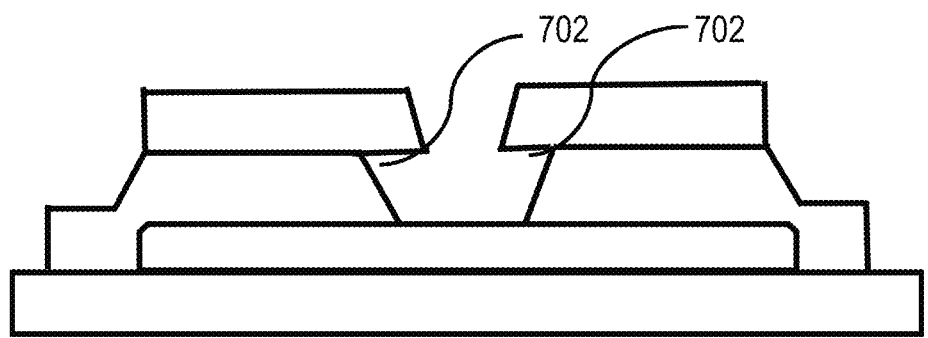
FIG. 7-10 show various structures on which layers can be formed using the reactor of FIG. 1, in accordance with some embodiments.
Figure 8:
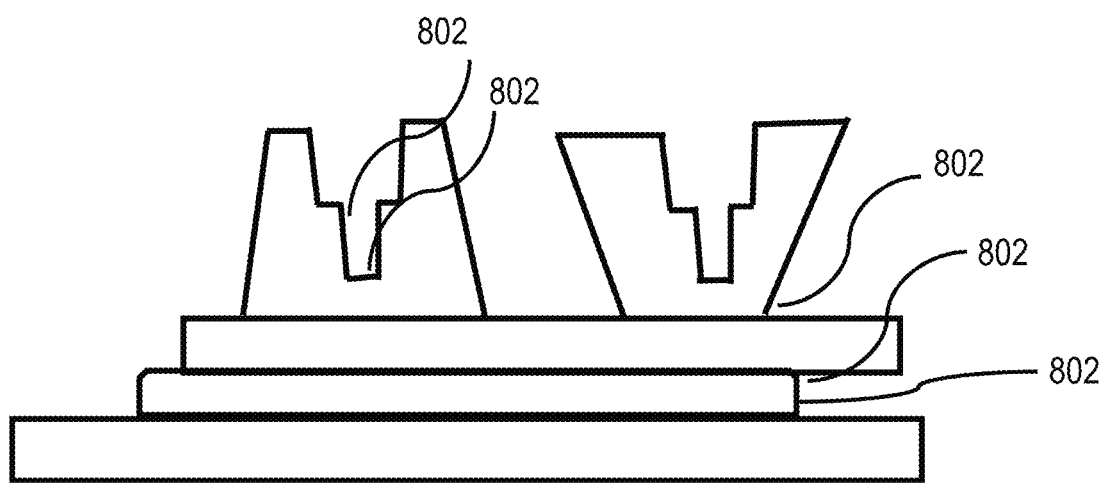

For example, FIG. 7 shows problem regions 702 for deposition overlying a substrate (e.g., substrate 108). FIG. 8 shows problem regions 802 for deposition overlying a substrate (e.g., substrate 108).

Figure 9:
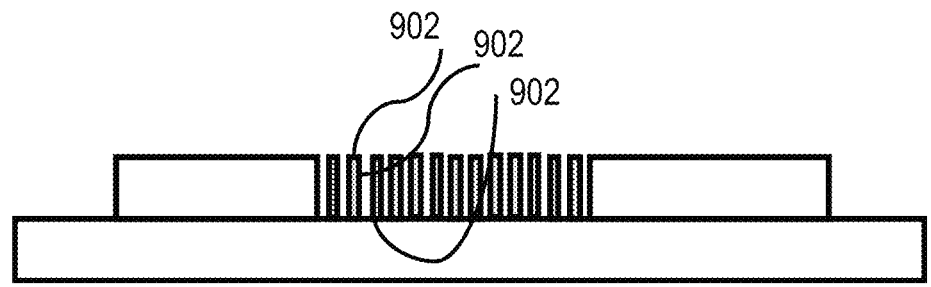

FIG. 9 shows problem regions 902 for deposition overlying a substrate (e.g., substrate 108). As illustrated, memory cell stacks are separated by trenches having a high aspect ratio. Each memory cell stack has sidewalls onto which films need to be formed at the bottom of the trenches.

Figure 10:
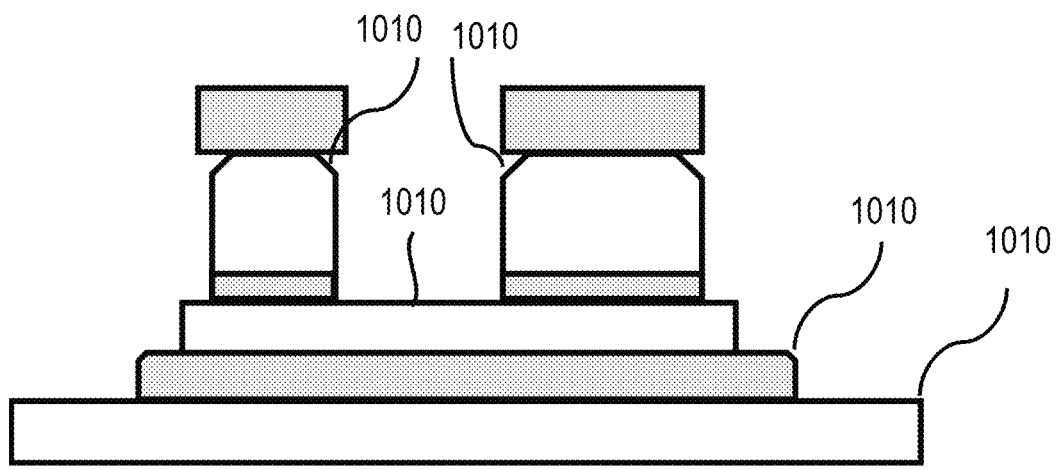

FIG. 10 shows problem regions 1010 for deposition overlying a substrate (e.g., substrate 108). For example, regions 1010 include corners having a half-bevel, corners having a top obstruction, a bottom of a high-aspect ratio trench separating two structures, and a flat edge of a bottom substrate.

FIG. 11 shows a table of non-limiting, exemplary reactants and corresponding reaction products used to form layers in a reactor (e.g., reactor 102 of FIG. 1), in accordance with some embodiments. Specifically, the table presents process parameters for selected precursor pairs for performing an atomic layer deposition (ALD) of the indicated type (thermal or plasma-enhanced).

As illustrated, a first reactant corresponds to the column labeled "Precursor". A second reactant corresponds to the column labeled "Reactant/Plasma Gas". The column labeled "Second Temperature" indicates the temperature to which the target substrate is heated when the second reactant is provided to the reactor. In one example, temperature controller 110 causes substrate support 106 to be heated so that substrate 108 achieves the Second Temperature provided in the illustrated table. The column labeled "Deposited Materials" indicates the reaction product of the first reactant and the second reactant.

The abbreviations as used and illustrated in FIG. 11 correspond to the following:
RT: room temperature
DEZ: diethylzinc
TMA: trimethylaluminium
TIP: titaniumisopropoxide
TDMAT: tetrakis-dimethyl-amino titanium
GaMe3: trimethylgallium
MeCp: 1-Methyl-cyclopentadienyl
Si-precursors: TEOS (tetraethyl orthosilicate) or PSZ: polysilazane In one embodiment, an apparatus includes: a reactor (e.g., 102) having at least one chamber; a substrate support (e.g., 106) configured to hold a substrate in the chamber; a flow controller (e.g., 114) configured to control flows of reactants into the chamber, the reactants including a first reactant and a second reactant, where the second reactant is provided into the chamber after providing the first reactant into the chamber; and a temperature controller (e.g., 110) configured to control a temperature of the substrate. The temperature is controlled to a first temperature when the first reactant is provided into the chamber so that a condensed portion of the first reactant is adsorbed on the substrate. The temperature is controlled to a second temperature when the second reactant is provided into the chamber, where the second temperature is greater than the first temperature, and the condensed portion of the first reactant is partially vaporized. The second reactant reacts with the first reactant to form a reaction product on the substrate.

In one embodiment, the first temperature is 25 degrees Celsius or lower.

In one embodiment, the second temperature is greater than the first temperature by at least 50 degrees Celsius.

In one embodiment, the substrate support is further configured to perform at least one of rotating the substrate, tilting the substrate, moving the substrate horizontally, or moving the substrate vertically.

In one embodiment, the apparatus further includes a gas distributor (e.g., 116) configured to distribute the reactants into the chamber as a vapor and towards the substrate.

In one embodiment, a memory array is located at a top surface of the substrate, the memory array includes memory cell stacks (e.g., 404), and the reaction product is at least one layer (e.g., 406) formed on sidewalls of the memory cell stacks.

In one embodiment, trenches (e.g., 408) are located between the memory cell stacks, the first reactant and the second reactant react in the trenches to form the layer on the sidewalls, each trench has a height (e.g., 410) and a width (e.g., 412), and an aspect ratio of each trench as determined by the height divided by the width is greater than 10:1.

In one embodiment, each memory cell stack includes a logic storage element (e.g., 414) and a tungsten layer (e.g., 416) underlying the logic storage element, and at least a portion of each sidewall is formed on the tungsten layer.

In one embodiment, the logic storage element includes chalcogenide, the first reactant is diethylzinc, the second reactant is water, and the reaction product is zinc oxide.

In one embodiment, the first reactant is activated by controlling the temperature to the second temperature.

In one embodiment, the temperature of the substrate is controlled by at least one of heating or cooling the substrate support.

In one embodiment, the apparatus further includes at least one of a radio frequency (RF) generator operating at a frequency of at least 13 MHz and configured to create an RF field that activates the second reactant, or a radio frequency (RF) generator operating at a frequency of less than 1 MHz and configured to bias the substrate support to provide directionality for activated portions of at least one of the first reactant or the second reactant.

In one embodiment, the at least one chamber includes a first chamber and a second chamber; the first reactant is provided into the first chamber; after performing a purge of the first chamber, the substrate is moved from the first chamber to the second chamber; and after moving the substrate to the second chamber, the second reactant is provided into the second chamber.

In one embodiment, a device includes: a memory array at a top surface of a substrate (e.g., 402), where the memory array includes memory cell stacks (e.g., 404); and at least one layer formed on sidewalls of the memory cell stacks. The layer is formed at least by: holding the substrate in a reactor (e.g., 102); controlling a temperature associated with the substrate to a first temperature; providing a first reactant into the reactor, where a condensed portion of the first reactant is adsorbed on the substrate; after the condensed portion of the first reactant is adsorbed on the substrate, controlling the temperature to a second temperature, where the second temperature is greater than the first temperature; and providing a second reactant into the reactor, where the second reactant reacts with the first reactant to form the layer on the sidewalls.

In one embodiment, the device further includes trenches (e.g., 408) located between the memory cell stacks, where the first reactant and the second reactant react in the trenches to form the layer on the sidewalls.

Figure 12:
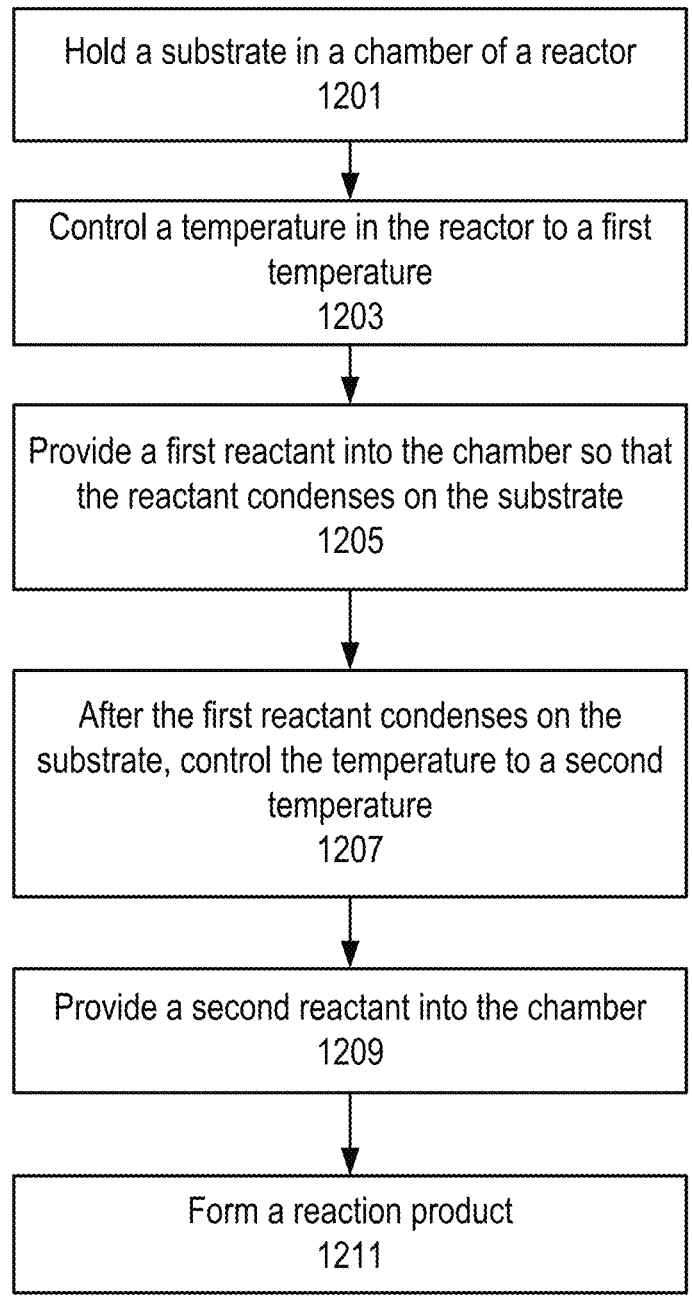
FIG. 12 shows a method to form layers on sidewalls of memory cell stacks or on other structures in semiconductor devices, in accordance with some embodiments.

FIG. 12 shows a method to form one or more layers (e.g., in the form of a film) on sidewalls of memory cell stacks or on other structures in semiconductor devices, in accordance with some embodiments. For example, the method of FIG. 12 can be used to form film 406 of FIG. 4. In one example, the memory cells stacks are part of a memory array in a memory device (e.g., cross point architecture RAM, or NAND flash memory). In one example, the memory device is a solid-state drive.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1201, a substrate is held in a chamber of reactor (e.g., on a susceptor). In one example, substrate 108 is held in chamber 104 of reactor 102.

At block 1203, a temperature in the reactor is controlled to a first temperature. In one example, temperature controller 110 controls substrate 108 and/or substrate support 106 to the first temperature, or controls each to respective first temperatures.

At block 1205, a first reactant is provided into the chamber so that the reactant condenses on the substrate. In one example, first reactant 120 is provided into chamber 104.

At block 1207, after the first reactant condenses on the substrate, the temperature is controlled to a second temperature. In one example, temperature controller 110 controls the temperature of substrate 108 to a second temperature.

At block 1209, a second reactant is provided into the chamber. In one example, second reactant 122 is provided into chamber 104.

At block 1211, a reaction product is formed. In one example, the reaction product is film 406 on memory cell stack 404.

In one embodiment, a method includes: holding a substrate in at least one chamber of a reactor (e.g., 102); controlling a temperature (e.g., using temperature controller 110) in the reactor to a first temperature; providing a first reactant (e.g.,120) into the chamber, where a portion of the first reactant condenses on the substrate; after the portion of the first reactant condenses on the substrate, controlling the temperature to a second temperature, where the second temperature is greater than the first temperature; and providing a second reactant (e.g., 122) into the chamber, where the second reactant reacts with the first reactant to form a reaction product.

In one embodiment, the first reactant includes tetraethyl orthosilicate or polysilazane, the second reactant includes diatomic oxygen, and the reaction product is silicon oxide.

In one embodiment, the method further includes holding the substrate in the reactor using a substrate support (e.g., 106). The first and second temperatures are temperatures of the substrate support; controlling the temperature to the first temperature includes cooling the substrate support; and controlling the temperature to the second temperature includes heating the substrate support.

In one embodiment, the method further includes, while providing the first reactant into the chamber, performing at least one of rotating the substrate, tilting the substrate, moving the substrate horizontally, or moving the substrate vertically.

In one embodiment, the method further includes: prior to holding the substrate in the chamber, forming a memory array on the substrate. The memory array includes memory cell stacks (e.g., 404), and each memory cell stack includes a chalcogenide layer (e.g., 414) overlying a tungsten layer (e.g., 416). The reaction product is at least one layer formed on a sidewall of each memory cell stack.

In one embodiment, a substrate support (e.g., chuck or susceptor) is located within an ALD reactor (e.g. reactor 102) and is configured to support one or more substrates or wafers during the atomic layer deposition process. Prior to processing, one or more substrates are placed on the substrate support or susceptor. In some arrangements, the substrate support is adapted to rotate within the deposition chamber (e.g., chamber 104). Once processing is complete, the wafer can be removed from the deposition chamber.

In one embodiment, the ALD reactor further includes a gas distribution system. The gas distribution system includes at least two gas inlet lines leading from vapor sources, and an exhaust line leads to a vacuum pump.

In one embodiment, the gas distribution system is configured to route reactant and purge gases through the ALD reactor. For example, the gas distribution system periodically routes reactant gases that enter the ALD reactor via the inlet lines to the deposition chamber. More specifically, the gas distribution system routes a first reactant gas, via a first reactant inlet line to the deposition chamber. Once in the deposition chamber, a portion of the first reactant gas adsorbs on the surface of the wafer. Next, the gas distribution system routes a purge gas to the deposition chamber. The purge gas displaces the portion of the first reactant gas that was not adsorbed on the surface of the substrate or wafer, as well as possible byproduct. The displaced portion of the first reactant gas and the purge gas exits the deposition chamber via the exhaust line. Thereafter, a second vapor phase reactant is provided to react with the adsorbed monolayer, via a second reactant inlet line and excess second reactant and byproduct is purged. In some arrangements, ALD cycles can also include third, fourth, etc. reactant pulses, with attendant purge steps.

In one embodiment, an ALD control system (e.g., software and/or firmware executing on processing device 112) is configured to control the ALD reactor before and during processing of the wafer. For example, the ALD control system can include control software and electrically controlled valves to control the flow of reactant and purge gases into and out of the ALD reactor.

The ALD control system loads substrate(s) into the deposition chamber and flows reactant and/or purge gases into the ALD reactor to form a deposit on the substrate (e.g., silicon wafer). The ALD control system can include modules such as a software or hardware component (e.g., a FPGA or ASIC), which performs certain tasks. A module can advantageously be configured to reside on the addressable storage medium of the ALD control system and be configured to execute on one or more processors.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations of an ALD reactor may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Functions can be implemented using hardwired circuitry without software instructions, or in combination with software instructions. Thus, the techniques are not limited to any specific combination of hardware circuitry and software, nor to any particular source for the instructions executed by a computing device.

The reactor 102 can include one or more processing devices (e.g., processing device 112), such as a microprocessor, executing sequences of instructions contained in a memory, such as ROM, volatile RAM, non-volatile memory, cache or a remote storage device.

Routines executed to implement memory operations may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods for a reactor. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement various functions of a memory device. Thus, the techniques are neither limited to any specific combination of hardware circuitry and software nor to any particular source for the instructions executed by a computing device.

Various embodiments set forth herein can be implemented for memory arrays in memory devices that are used in a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
   a reactor having at least one chamber;
   a substrate support configured to hold a substrate in the chamber;
   a flow controller configured to control flows of reactants into the chamber, the reactants including a first reactant and a second reactant, wherein the second reactant is provided into the chamber after providing the first reactant into the chamber; and
   a temperature controller configured to control a temperature of the substrate, wherein:
      the temperature is controlled to a first temperature when the first reactant is provided into the chamber, to have a portion of the first reactant condense and adsorbed on the substrate;
      the temperature is controlled to a second temperature when the second reactant is provided into the chamber, wherein the second temperature is greater than the first temperature, and partially vaporize the condensed portion of the first reactant; and
      the second reactant reacts with the first reactant to form a reaction product on the substrate, wherein a memory array is located at a top surface of the substrate, the memory array comprises memory cell stacks, each memory cell stack comprises a logic storage element, the logic storage element comprises chalcogenide, the first reactant is diethylzinc, the second reactant is water, and the reaction product is zinc oxide.

2. The apparatus of claim 1, wherein the first temperature is 25 degrees Celsius or lower.

3. The apparatus of claim 2, wherein the second temperature is greater than the first temperature by at least 50 degrees Celsius.

4. The apparatus of claim 1, wherein the substrate support is further configured to perform at least one of rotating the substrate, tilting the substrate, moving the substrate horizontally, or moving the substrate vertically.

5. The apparatus of claim 1, further comprising a gas distributor configured to distribute the reactants into the chamber as a vapor and towards the substrate.

6. The apparatus of claim 1, wherein the reaction product is at least one layer formed on sidewalls of the memory cell stacks.

7. The apparatus of claim 6, wherein trenches are located between the memory cell stacks, the first reactant and the second reactant react in the trenches to form the layer on the sidewalls, each trench has a height and a width, and an aspect ratio of each trench as determined by the height divided by the width is greater than 10:1.

8. The apparatus of claim 6, wherein each memory cell stack further comprises a tungsten layer underlying the logic storage element, and at least a portion of each sidewall is formed on the tungsten layer.

9. The apparatus of claim 1, wherein the first reactant is activated by controlling the temperature to the second temperature.

10. The apparatus of claim 1, wherein the temperature of the substrate is controlled by at least one of heating or cooling the substrate support.

11. The apparatus of claim 1, further comprising at least one of a radio frequency (RF) generator operating at a frequency of at least 13 MHz and configured to create an RF field that activates the second reactant, or a radio frequency (RF) generator operating at a frequency of less than 1 MHz and configured to bias the substrate support to provide directionality for activated portions of at least one of the first reactant or the second reactant.

12. The apparatus of claim 1, wherein:
the at least one chamber comprises a first chamber and a second chamber;
the first reactant is provided into the first chamber;
after performing a purge of the first chamber, the substrate is moved from the first chamber to the second chamber; and
after moving the substrate to the second chamber, the second reactant is provided into the second chamber.

13. A reactor comprising:
a substrate support configured to hold a substrate in the reactor, wherein the substrate is held while a memory array is formed at a top surface of the substrate, the memory array comprises memory cell stacks, and at least one layer is formed on sidewalls of the memory cell stacks; and
a processing device configured to execute non-transitory computer readable instructions stored on a memory that, upon execution, cause the processing device to:
control a temperature of the substrate support to a first temperature;
provide a first reactant into the reactor, wherein the first reactant condenses and is adsorbed on the substrate;
after the condensed portion of the first reactant is adsorbed on the substrate, control the temperature to a second temperature, wherein the second temperature is greater than the first temperature; and
provide a second reactant into the reactor, wherein the second reactant reacts with the first reactant to form the layer on the sidewalls,
wherein a memory array is located at a top surface of the substrate, the memory array comprises memory cell stacks, each memory cell stack comprises a logic storage element, the logic storage element comprises chalcogenide, the first reactant is diethylzinc, the second reactant is water, and the layer is zinc oxide.

14. The reactor of claim 13, wherein trenches are located between the memory cell stacks, and wherein the first reactant and the second reactant react in the trenches to form the layer on the sidewalls.

15. An apparatus comprising:
a reactor; and
a controller configured to:
control a temperature in the reactor to a first temperature when a first reactant in a gas phase is provided into the reactor, wherein the first temperature is to cause a portion of the first reactant to condense from the gas phase onto a substrate; and
increase the temperature to a second temperature when a second reactant is provided into the reactor, wherein increasing to the second temperature causes the condensed portion of the first reactant to partially vaporize,
wherein a memory array is located at a top surface of the substrate, the memory array comprises memory cell stacks, each memory cell stack comprises a logic storage element, the logic storage element comprises chalcogenide, the first reactant is diethylzinc, and the second reactant is water.

16. The apparatus of claim 15, wherein a memory array is located at a top surface of the substrate, the memory array comprises memory cell stacks, and a reaction product is at least one layer formed on sidewalls of the memory cell stacks.

17. The apparatus of claim 15, wherein the temperature is a temperature of a substrate support that holds the substrate.

18. The apparatus of claim 15, wherein the condensed portion of the first reactant is partly vaporized by supplying a heated gas to the substrate.

* * * * *